(12) United States Patent
Kuwabara et al.

(10) Patent No.: US 11,004,830 B2
(45) Date of Patent: May 11, 2021

(54) CONTROL SYSTEM, SEMICONDUCTOR DEVICE AND METHOD OF THE SEMICONDUCTOR DEVICE

(71) Applicant: RENESAS ELECTRONICS CORPORATION, Tokyo (JP)

(72) Inventors: Shinichi Kuwabara, Ibaraki (JP); Yasutaka Nakashiba, Ibaraki (JP); Tetsuya Iida, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/598,806

(22) Filed: Oct. 10, 2019

(65) Prior Publication Data
US 2020/0161278 A1    May 21, 2020

(30) Foreign Application Priority Data
Nov. 21, 2018   (JP) .............. JP2018-218361

(51) Int. Cl.
*H01L 25/065* (2006.01)
*H03K 17/687* (2006.01)
*H01L 25/00* (2006.01)

(52) U.S. Cl.
CPC .......... *H01L 25/0657* (2013.01); *H01L 25/50* (2013.01); *H03K 17/687* (2013.01)

(58) Field of Classification Search
CPC ............... G09G 3/3233; G09G 3/3266; G09G 2320/043; G09G 2300/0852; H01L 25/0657; H01L 25/50; H01L 2224/48091; H01L 2224/32245; H01L 2224/48247; H01L 2224/08145; H01L 23/5223; H03K 17/687
See application file for complete search history.

(56) References Cited

U.S. PATENT DOCUMENTS

| | | | | |
|---|---|---|---|---|
| 5,896,059 | A * | 4/1999 | Durham | H03K 19/003 326/38 |
| 10,331,201 | B2 * | 6/2019 | Steudel | H01L 23/525 |
| 2009/0079385 | A1 * | 3/2009 | Xiao | H02M 3/07 320/102 |
| 2017/0063222 | A1 * | 3/2017 | Teh | H02M 3/07 |
| 2019/0035732 | A1 * | 1/2019 | Pelletier | G06F 1/3243 |

FOREIGN PATENT DOCUMENTS

| | | | |
|---|---|---|---|
| JP | 2010016238 | * | 1/2010 |
| JP | 02010016238 A | * | 1/2010 |
| JP | 2018-061320 A | | 4/2018 |

* cited by examiner

*Primary Examiner* — Sibin Chen
(74) *Attorney, Agent, or Firm* — McDermott Will & Emery LLP

(57) ABSTRACT

The control system according to embodiments includes a switching element, a control unit controlling the conductive state of the switching element, and a first capacitor storing charge supplied to the control unit. The first capacitor and the control unit are connected with each other via the switching element.

8 Claims, 40 Drawing Sheets

CONTROL SYSTEM, SEMICONDUCTOR DEVICE AND METHOD OF THE SEMICONDUCTOR DEVICE

CROSS-REFERENCE TO RELATED APPLICATIONS

The disclosure of Japanese Patent Application No. 2018-218361 filed on Nov. 21, 2018 including the specification, drawings and abstract is incorporated herein by reference in its entirety.

BACKGROUND

The present disclosure relates to control system, semiconductor device and method of the semiconductor device.

An electronic device is described in Japanese Patent Application Publication No. 2018-61320 (Patent Document 1). The electronic device described in Patent Document 1 includes a first secondary battery and a second secondary battery. The first secondary battery supplies electric power during normal operation. The second secondary battery supplies electric power in an emergency. The first secondary battery and the second secondary battery are, for example, lithium ion secondary batteries.

In the electronic device described in Patent Document 1, since the lithium ion secondary battery is used as the first secondary battery and the second secondary battery, there is a concern that the device becomes large in size and deteriorates with time.

Other objects and novel features will become apparent from the description of this specification and the accompanying drawings.

SUMMARY

The control system according to embodiments includes a switching element, a control unit for controlling the conduction state of the switching element, and a first capacitor for storing charge supplied to the control unit. The first capacitor and the control unit are connected with each other via a switching element.

According to the control system according to embodiments, it is possible to miniaturize device and suppress deterioration with time.

BRIEF DESCRIPTION OF THE DRAWINGS

FIG. 15 is a cross-sectional view is the first chip CHP1 of the semiconductor device according to the embodiment in a premetal insulating film forming step S12a.

DETAILED DESCRIPTION

Figure 1:
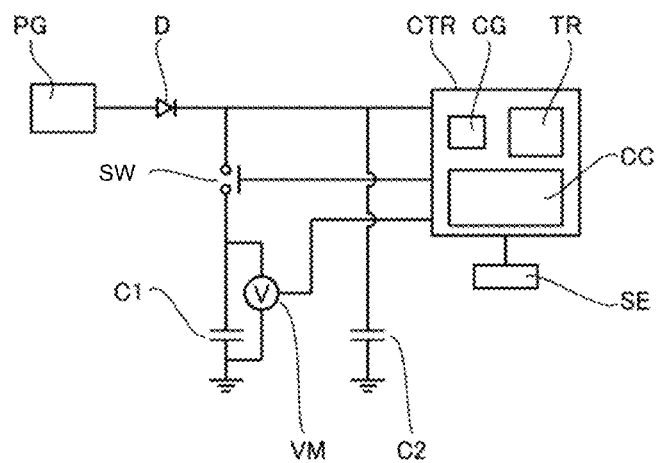
FIG. 1 is a functional block diagram of a control system according to embodiment.

In the following drawings, the same or corresponding parts are denoted by the same reference numerals, and the description thereof will not be repeated.

Hereinafter, a configuration of a control system according to embodiment will be described.

The control system according to embodiment is, for example, a control system used in an Internet on Things (IoT) device. As shown in FIG. 1, the control system according to embodiment includes a switching element SW, a control unit CTR, and a capacitor C1. The control system according to the embodiment may further include a capacitor C2 and a voltage measurement unit VM.

The switching element SW is formed of, for example, a transistor. The control unit CTR is configured to be able to control the conduction state of the switching element SW. More specifically, the control unit CTR is electrically connected to the gate of the transistor included in the switching element SW, and switches the on-state and the off-state of the transistor.

The control unit CTR includes, for example, a control circuit CC, a transmission/reception unit TR, and a clock generation circuit CG. The control circuit CC includes, for example, a Central Processing Unit (CPU). The transmission/reception unit TR communicates with the outside. The transmission/reception unit TR is composed of, for example, a baseband circuit and a modem circuit. The clock generation circuit CG generates a clock signal necessary for the operation of the control unit CTR. The clock generation circuit CG includes a clock oscillator, an on-chip oscillator, a Phase Lock Loop circuit, a selector circuit, and the like. The control unit CTR is configured by, for example, a microcontroller.

The control unit CTR is configured to be able to control a sensor SE. The sensor SE is, for example, a pressure sensor, a temperature sensor, a humidity sensor, an image sensor, or the like.

The control unit CTR executes an operation belonging to a first group and an operation belonging to a second group. A power consumption of the operation belonging to the second group is smaller than a power consumption of the operation belonging to the first group.

The operation belonging to the first group includes, for example, communication with the outside by the transmitting/receiving unit TR. The operations belonging to the first group may include control over the sensor SE, such as driving the sensor SE, transmitting and receiving signals to and from the sensor SE, etc.

The operation belonging to the second group includes, for example, driving of the clock generation circuit CG. The operation belonging to the second group may include transmission and reception of control signals between the control circuit CC and each part of the control unit CTR.

The capacitor C1 is electrically connected with the control unit CTR via the switching element SW. More specifically, one electrode of the capacitor C1 is electrically connected with a drain of the transistor constituting the switching element SW, another electrode of the capacitor C1 is grounded, and a source of the transistor constituting the switching element SW is electrically connected with the control unit CTR.

Although only one capacitor C1 is illustrated in FIG. 1, the number of the capacitors C1 may be plural. When the number of the capacitors C1 is plural, the control system according to the embodiment has the same number of switching element SW as the number of the capacitors C1.

The capacitor C2 is electrically connected with the control unit CTR. More specifically, one electrode of the capacitor C2 is electrically connected with the control unit CTR, and another electrode of the capacitor C2 is grounded. Although only the capacitor C2 is illustrated in FIG. 1, the number of the capacitors C2 may be plural.

The voltage measuring unit VM is connected in parallel with the capacitor C1. The voltage measuring unit VM measures a voltage of the capacitor C1. The voltage measuring unit VM is electrically connected with the control unit CTR.

The control system according to the embodiment is connected with the power generating element PG. The power generating element PG is, for example, a solar cell, a piezoelectric element, a Peltier element, or the like. That is, the power generating element PG is an element that generates power using energy of an external environment such as light, temperature difference, pressure, and the like. The power generating element PG supplies electric power to the control system according to the embodiment. In the control system according to the embodiment, power supply may be performed from outside to Radio Frequency (RF) by connecting the control system to antennas (not shown) instead of the power generating element PG.

More specifically, the power generating element PG is electrically connected with the control unit CTR via the diode D. As a result, electric power is supplied from the power generating element PG to the control unit CTR.

The power generating element PG is electrically connected with the capacitor C1 via the switching element SW, and is also electrically connected with the capacitor C2. As a result, the electric power from the power generating element PG is accumulated in the capacitor C1 and the capacitor C2.

The operation of the control system according to the embodiment will be described below.

When the amount of power generated by the power generating element PG (the amount of power supplied from the power generating element PG) is sufficiently large and the control unit CTR performs the operation belonging to the second group, the control unit CTR performs the operation based only on the power from the power generating element PG. That is, when the control unit CTR performs the operation belonging to the second group, the control unit CTR turns off the switching element SW. At this time, the electric power from the power generating element PG is also supplied to the capacitor C2, and the capacitor C2 is charged.

At this time, the control unit CTR measures the voltage of the capacitor C1 via the voltage measurement unit VM. Then, if the measured value is equal to or less than a threshold value, the control unit CTR controls the switching element SW to be in a conductive state (ON state), thereby causing the capacitor C1 to also supply power from the power generating element PG, thereby charging the capacitor C1.

When the control unit CTR performs the operation belonging to the second group but the amount of power generated by the power generating element PG decreases and the control unit CTR cannot be operated only by the amount of power generated by the power generating element PG, the control unit CTR performs the operation based on the electric power from the power generating element PG and the electric power accumulated in the capacitor C2.

When the control unit CTR intends to perform an operation belonging to the first group, the control unit CTR performs control so as to bring the switching element SW into a conductive state. As a result, the control unit CTR can operate based on the electric power from the power generating element PG, the electric power stored in the capacitor C1, and the electric power stored in the capacitor C2.

In some cases, a formation defect occurs in a part of a plurality of capacitors C1. The control unit CTR performs control to keep the switching element SW connected to the capacitor C1 in which the formation defect occurs in a non-conductive state (OFF state) at all times. This makes it possible to separate the capacitor C1 in which the formation defect has occurred from the other capacitor C1, i.e., the capacitor C1 operating normally.

Hereinafter, a configuration of a semiconductor device according to the embodiment will be described.

Figure 2:
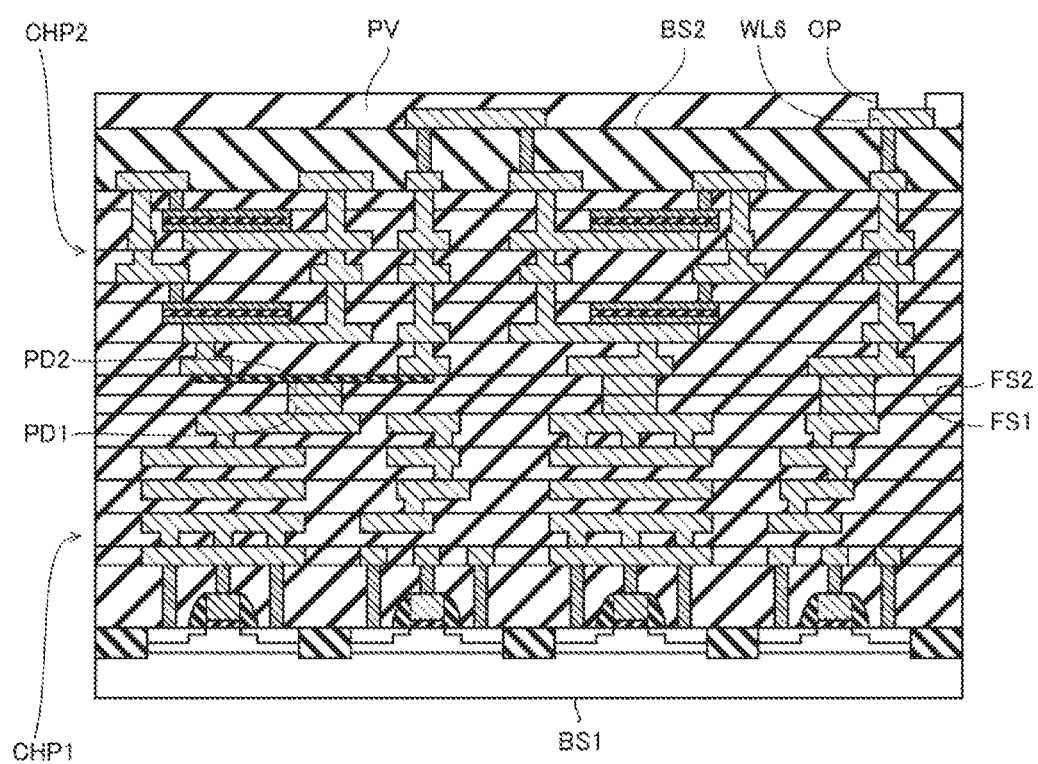
FIG. 2 is a cross-sectional view of a semiconductor device according to the embodiment.

As shown in FIG. 2, the semiconductor device according to the embodiment includes a first chip CHP1, a second chip CHP2, and a passivating film PV.

The first tip CHP1 has a front surface FS1 and a back surface BS1. The back BS1 is the other side of the front FS1. The second tip CHP2 has a front surface FS2 and a back surface BS2. The back BS2 is the other side of the front FS2. The surface FS1 and the surface FS2 are laminated to each other.

The passivating film PV is formed on the back surface BS2 of the passivating film PV. The passivation film PV is comprised of, for example, silicon nitride. In the passivating film PV, an opening OP for exposing a wiring WL6 (to be described later) is formed. The wiring WL6 exposed from the opening OP is electrically connected with the power generating device PG via a bonding wire BW and a lead frame LF, which will be described later.

Figure 3:
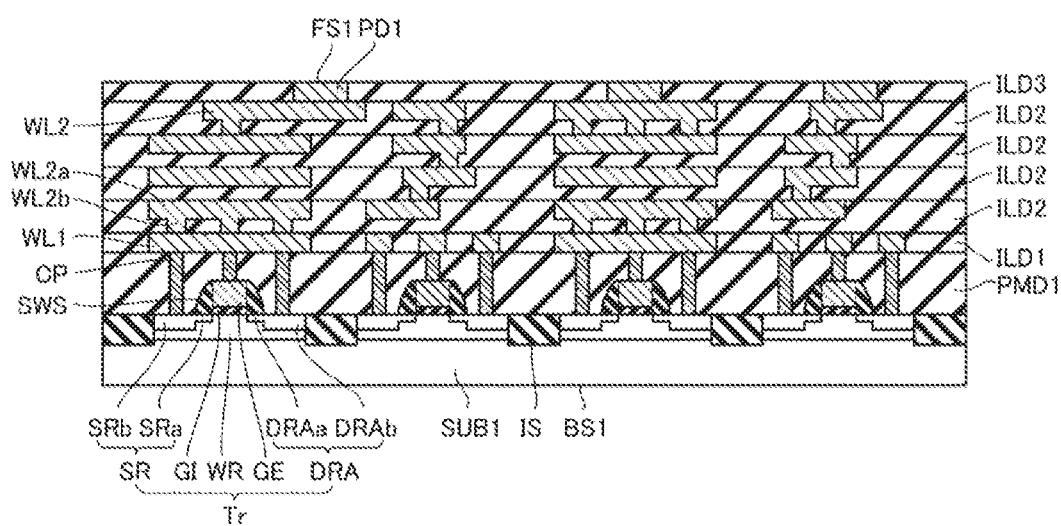
FIG. 3 is a cross-sectional view of a first chip CHP1 of the semiconductor device according to the embodiment.

As shown in FIG. 3, the first chip CHP1 includes a semiconductor substrate SUB1, a gate dielectric film GI, a gate electrodes GE, a sidewall spacer SWS, and an element isolation part IS. The first chip CHP1 further includes a premetal insulating film PMD1, a contact plug CP, interlayer insulating films ILD1 to ILD3, a wiring WL1 and a wiring WL2, and an electrode pad PD1.

The semiconductor substrate SUB1 is comprised of, for example, single-crystal silicon (Si). The semiconductor substrate SUB 1 has a source region SR, a drain region DRA, and a well region WR. The source region SR and the drain region DRA are formed on a surface of the semiconductor substrate SUB1. The source region SR and the drain region DRA are spaced apart from each other.

The well region WR is formed on the semiconductor substrate SUB1 so as to surround the source region SR and the drain region DRA. The well region WR has a portion sandwiched between the source region SR and the drain region DRA, hereinafter referred to as a channel region.

The conductivity types of the source region SR and the drain region DRA are the first conductivity type. The conductivity type of the well region WR is the second conductivity type. The second conductivity type is the opposite conductivity type of the first conductivity type. For example, when the first conductivity type is n-type, the second conductivity type is p-type.

The source region SR has a first portion SRa and a second portion SRb. The first portion SRa is located closer to the drain region DRA than the second portion SRb. An impurity concentration in the first portion SRa is smaller than an impurity concentration in the second portion SRb. That is, the source region SR has an Lightly Doped Diffusion (LDD) structure.

The drain region DRA has a first portion DRAa and a second portion DRAb. The first portion DRAa is located closer to the drain region DRA than the second portion DRAb. The impurity concentration in first portion DRAb is smaller than the impurity concentration in second portion DRAb. That is, the drain region DRA has an LDD structure.

The gate dielectric film GI is comprised of, for example, silicon oxide (SiO 2). The gate dielectric film GI is formed on the surfaces of the semiconductor substrate SUB1. More specifically, the gate dielectric film GI is formed on the channel region.

The gate electrode GE is comprised of, for example, polycrystalline silicon doped with an impurity. The gate electrode GE is formed on the gate dielectric film GI. Thus, the gate electrode GE faces the channel region while being insulated from the channel region.

The source region SR, the drain region DRA, the well region WR, the gate dielectric film GI, and the gate electrode GE constitute a transistor Tr. The transistor Tr is a transistor constituting the control unit CTR and the voltage measuring unit VM. That is, the first chip CHP1 includes a control unit CTR and a voltage measuring unit VM.

The sidewall spacer SWS is formed of, for example, a stacked film of silicon oxide and silicon nitride (Si 3 N 4). The sidewall spacer SWS is formed on both side surfaces of the gate electrode GE. That is, the sidewall spacer SWS is formed on the first portion SRa and the first portion DRAa.

The element isolation part IS is formed on the surface of the semiconductor substrate SUB 1 so as to insulate and isolate adjacent transistors Tr from each other. The element isolation part IS is, for example, an Shallow Trench Isolation. That is, the device isolation portion IS is formed of a groove formed on the surface of the semiconductor substrate SUB1 and an insulator filling the groove. The insulator is comprised of, for example, silicon oxide.

The premetal insulating film PMD1 is formed on the semiconductor substrate SUB1. The premetal insulating film PMD1 is comprised of, for example, silicon oxide. The contact plug CP is formed in the premetal insulating film PMD1. More specifically, the contact plug CP is buried in a contact hole formed in the premetal insulating film. The contact plug CP is electrically connected with the source region SR, the drain region DRA, and the gate electrode GE.

The interlayer insulating film ILD1 is formed on the premetal insulating film PMD1. The interlayer insulating film ILD1 is comprised of, for example, silicon oxide. A wiring WL1 is formed in the interlayer insulating film ILD1. More specifically, the wiring WL1 is buried in a wiring trench formed in an interlayer insulating film ILD1. The wiring WL1 is electrically connected with the contact plug CP. The wiring WL1 is made of, for example, Cu.

The interlayer insulating film ILD2 is formed on an interlayer insulating film ILD1. The interlayer insulating film ILD2 is comprised of, for example, silicon oxide. The wiring WL2 is formed in an interlayer insulating film ILD2. The wiring WL2 has a wiring portion WL2a and a via portion WL2b. The via portion WL2b is buried in a via trench formed in the interlayer insulating film ILD2, and the wiring portion WL2a is buried in a wiring trench formed in the interlayer insulating film ILD2. The wiring WL2 is electrically connected with the wiring of the lower layer through the via portion WL2b. The wiring WL2 is comprised of, for example, copper.

Note that a multilayered wiring structure may be realized by stacking a large number of structures including the interlayer insulating film ILD2 and the wiring WL2.

The interlayer insulating film ILD3 is formed on the uppermost interlayer insulating film ILD2. The interlayer insulating film ILD3 is comprised of, for example, silicon oxide. The electrode pad PD1 is formed in the interlayer insulating film ILD3. More specifically, the electrode pad PD1 is buried in a trench formed in the interlayer insulating film ILD3. The electrode pad PD1 is electrically connected with the wiring WL2 (wiring portion WL2a) in the uppermost layer. The upper surface of the electrode pad PD1 forms a part of the surface FS1 of the electrode pad. The electrode pad PD1 is comprised of, for example, copper.

Figure 4:
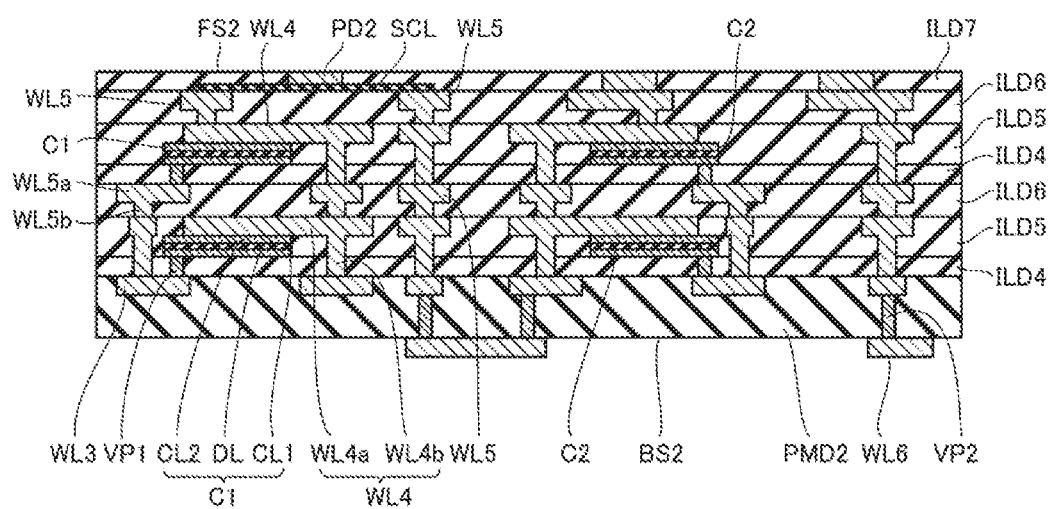
FIG. 4 is a cross-sectional view of a second chip CHP2 of the semiconductor device according to the embodiment.

As shown in FIG. 4, the second chip CHP2 includes a premetal insulating film PMD2, a wiring WL3 to a wiring WL6, a via plug VP1 and a via plug VP2, an interlayer insulating film ILD4 to an interlayer insulating film ILD7, a conductive film CL1 and a conductive film CL2, a dielectric film DL, a semiconductor film SCL, and an electrode pad PD2.

The premetal insulating film PMD2 is comprised of, for example, silicon oxide. The wiring WL3 is formed in the premetal insulating film PMD2. More specifically, the wiring WL3 is buried in a wiring trench formed in the premetal insulating film PMD2.

The interlayer insulating film ILD4 is formed on the premetal insulating film PMD2. The interlayer insulating film ILD4 is comprised of, for example, silicon oxide. A via plug VP1 is formed in the interlayer insulating film ILD4. More specifically, the via plug VP1 is buried in a via hole formed in the interlayer insulating film ILD4. The via plug VP1 is comprised of, for example, copper. The via plug VP1 is electrically connected with the lower wiring.

A conductive film CL1 is formed on the interlayer insulating film ILD4. The conductive film CL1 is comprised of, for example, titanium nitride (TiN). The conductive film CL1 is electrically connected with the via plug VP1. A dielectric film DL is formed on the conductive film CL1. The dielectric film DL is comprised of, for example, zirconium oxide (ZrO 2). A conductive film CL2 is formed on the dielectric film DL. The conductive film CL2 is comprised of, for example, titanium nitride (TiN). That is, the dielectric film DL is sandwiched between the conductive film CL1 and the conductive film CL2. The conductive film CL1, the conductive film CL2, and the dielectric film DL constitute a capacitor C1 and a capacitor C2.

The interlayer insulating film ILD5 is formed on the interlayer insulating film ILD4 so as to cover the capacitor C1 and the capacitor C2. The interlayer insulating film ILD5 is comprised of, for example, silicon oxide. The wiring WL4 has a wiring portion WL4a and a via portion WL4b. The via portion WL4b is buried in a via hole formed in the interlayer insulating film ILD4 and the interlayer insulating film ILD5. The via portion WL4b is electrically connected with the wiring of the lower layer. The wiring portion WL4a is buried in a wiring trench formed in the interlayer insulating film ILD5 so as to be electrically connected with the conductive film CL2.

The interlayer insulating film ILD6 is formed on the interlayer insulating film ILD5. The interlayer insulating film ILD6 is comprised of, for example, silicon oxide. A wiring WL5 is formed in the interlayer insulating film ILD6. The wiring WL5 has a wiring portion WL5a and a via portion WL5b. The via portion WL5b is electrically connected with the wiring of the lower layer. The via portion WL5b is buried in a via trench formed in the interlayer insulating film ILD6, and the wiring portion WL5a is buried in a wiring trench formed in the interlayer insulating film ILD6. The wiring WL5 is comprised of, for example, copper.

A plurality of structures including the interlayer insulating film ILD4, the interlayer insulating film ILD5, the interlayer insulating film ILD6, the via plug VP1, the wiring WL 4, the wiring WL 5, the conductive film CL1, the conductive film CL2, and the dielectric film DL may be stacked.

Semiconductor film SCLs are formed on the uppermost interlayer insulating film ILD6. The semiconductor film SCL is electrically connected with the wiring portion WL4a through the wiring WL 5. The portion of the semiconductor film SCL electrically connected with the wiring portion WL4a via the wiring WL5 serves as a source region and a drain region of a transistor included in the switching device SW. In this manner, the switching element SW is electrically connected with the capacitor C1.

The semiconductor film SCL is comprised of, for example, IGZO(InGaZnO). From another viewpoint, the transistor forming the switching element SW may be an IGZO transistor.

An interlayer insulating film ILD7 is formed on the interlayer insulating film ILD6 so as to cover the semiconducting film SCL. The interlayer insulating film ILD7 is comprised of, for example, silicon oxide. The electrode pad PD2 is formed in the interlayer insulating film ILD7. More specifically, the electrode pad PD2 is buried in a trench formed in the interlayer insulating film ILD7. The electrode pad PD2 is electrically connected with the semiconductor film SCL. The electrode pads PD2 electrically connected with the semiconductor film SCL serve as gate electrodes of the transistors included in the semiconductor film SCL. The upper surface of the electrode pad PD2 constitutes a part of the surface FS2 of the electrode pad.

As described above, the surface FS1 and the surface FS2 are laminated to each other, and by this laminating, the electrode pad PD1 and the electrode pad PD2 are electrically laminated to each other. As described above, the switching element SW is electrically connected with the capacitor C1 and the electrode pad PD2. Therefore, the capacitor C1 and the control unit CTR are electrically connected with each other via the switching element SW by laminating the surface FS1 and the surface FS2 to each other.

The via plug VP2 is formed in the premetal insulating film PMD2. More specifically, the via plug VP2 is buried in a via hole formed in the premetal insulating film PMD2. The via plug VP2 is comprised of, for example, copper. On the surface of the premetal insulating film PMD2 facing away from the interlayer insulating film ILD3, a wiring WL6 is formed. The wiring WL6 is comprised of aluminum (Al), for example.

A method of manufacturing of the semiconductor device according to the embodiment will be described bellow.

Figure 5:
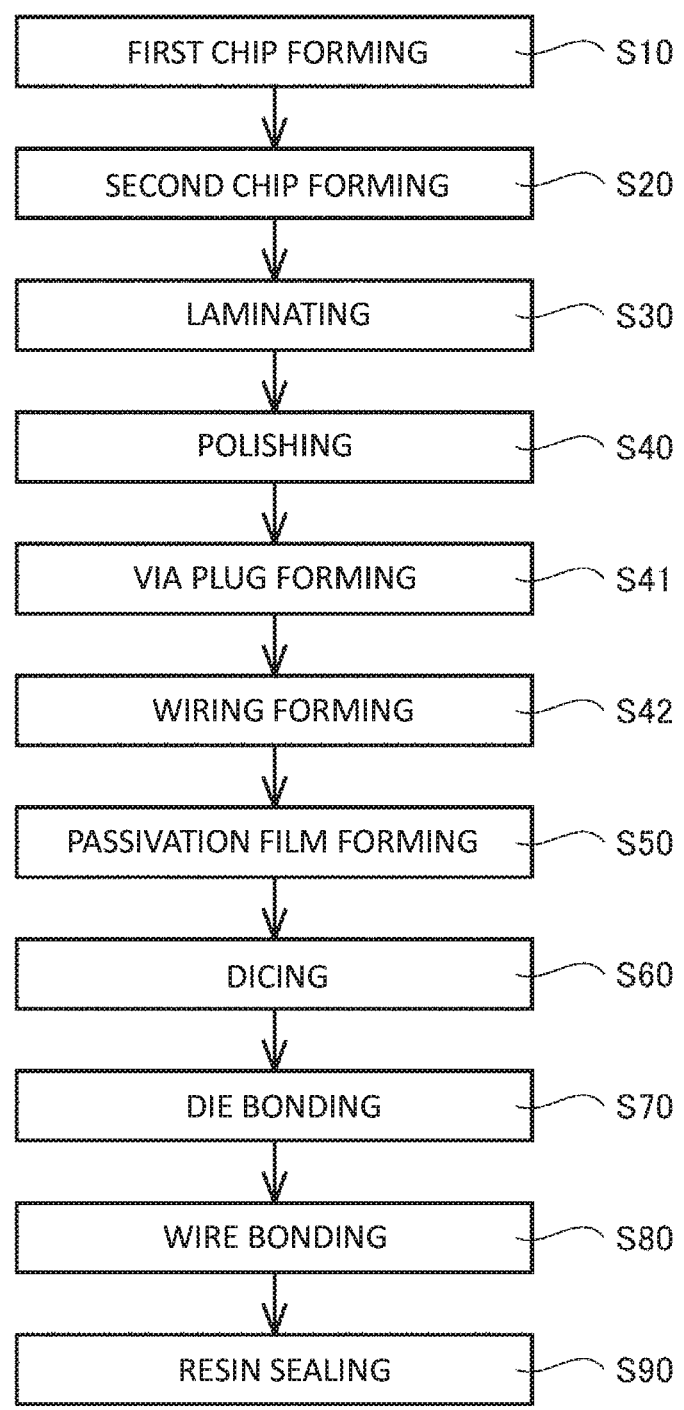
FIG. 5 is a flowchart illustrating a manufacturing method of the semiconductor device according to the embodiment.

As shown in FIG. 5, the method of manufacturing the semiconductor device according to the embodiment includes a first chip forming step S10, a second chip forming step S20, a laminating step S30, a polishing step S40, a via plug forming step S41, a wiring forming step S42, and a passivation film forming step S50. The method of manufacturing the semiconductor device according to the embodiment further includes a dicing step S60, a die bonding step S70, a wire bonding step S80, and a resin sealing step S90.

Figure 6:
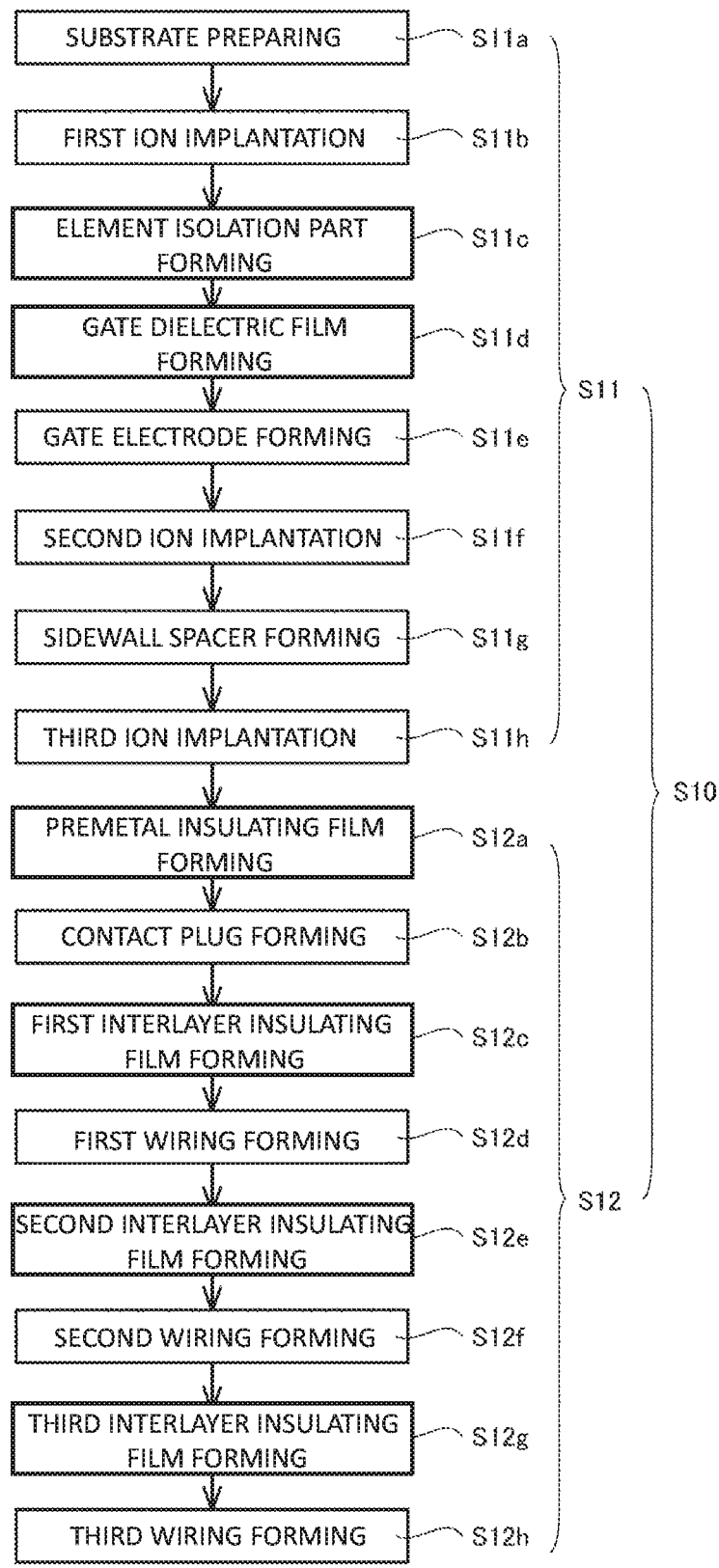
FIG. 6 is a detailed flowchart of the first chip forming step S10.

As shown in FIG. 6, the first chip forming step S10 includes a front end step S11 and a back end step S12.

The front end step S11 includes a substrate preparing step S11a, a first ion implantation step S11b, an element isolation part forming step S11c, a gate dielectric film forming step S11d, a gate electrode forming step S11e, a second ion implantation step S11f, a sidewall spacer forming step S11g, and a third ion implantation step S11h.

The back-end process S12 includes a premetal insulating film forming step S12a, a contact plug forming step S12b, a first interlayer insulating film forming step S12c, a first wiring forming step S12d, a second interlayer insulating film forming process S12e, a second wiring forming step S12f, a third interlayer insulating film forming step S12g, and an electrode pad forming step S12h.

Figure 7:
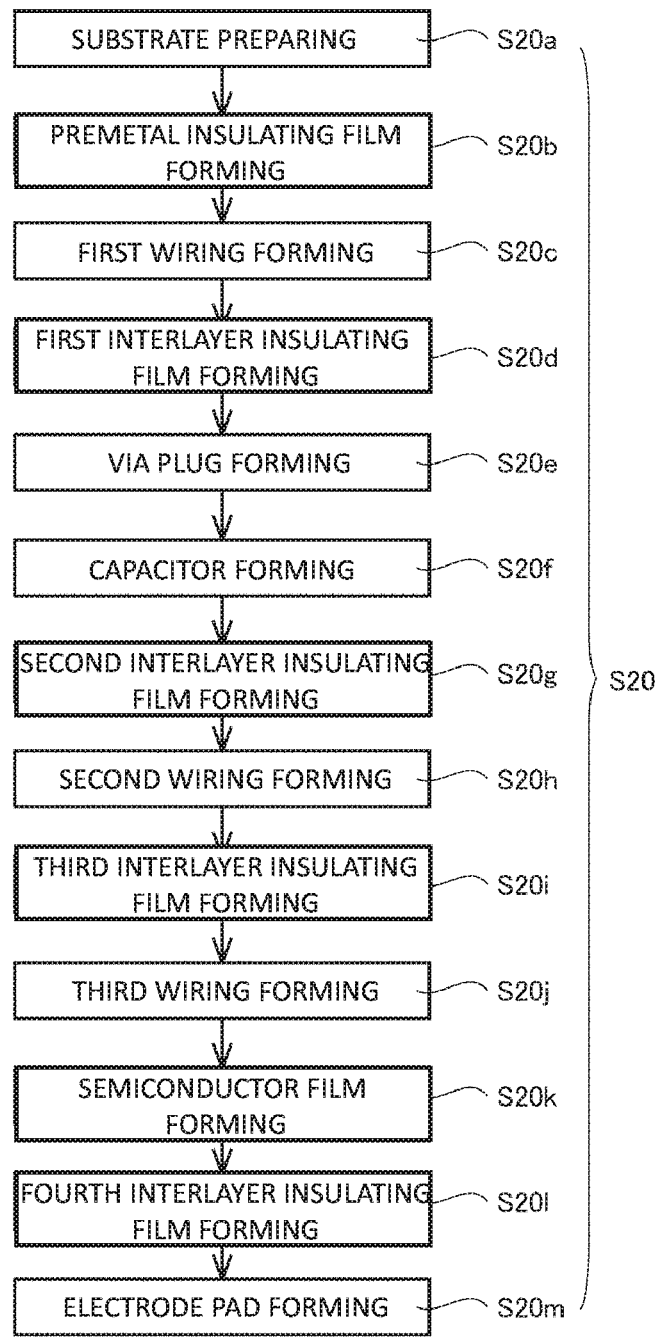
FIG. 7 is a detailed flowchart of the second chip forming step S20 is shown.

As shown in FIG. 7, the second chip forming step S20 includes a substrate preparing step S20a, a premetal insulating film forming step S20b, a first wiring forming step S20c, a first interlayer insulating film forming step S20d, a via plug forming step S20e, a capacitor forming step S20f, a second interlayer insulating film forming step S20g, a second wiring forming step S20h, a third interlayer insulating film forming step S20i, and a third wiring forming step S20j. The second chip-forming step S20 further includes a semiconductor film forming step S20k, a fourth interlayer insulating film forming step S20l, and an electrode pad forming step S20m.

Figure 8:
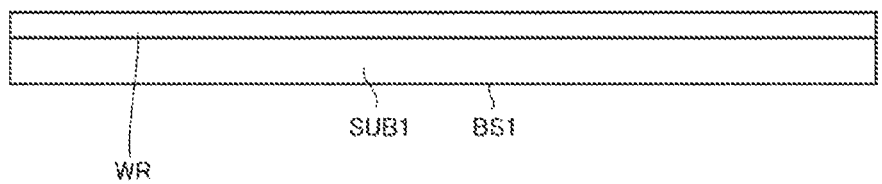
FIG. 8 is a cross-sectional view of the first chip CHP1 of the semiconductor device according to the embodiment in the first ion implantation step S11b.

In the substrate preparation step S11a, preparation of the semiconductor substrate SUB1 is performed. The first ion implantation step S11b is performed after the substrate preparation step S11a. As shown in FIG. 8, in the first ion implantation step S11b, well region WR is formed. The well region WR is formed by, for example, ion implantation.

Figure 9:
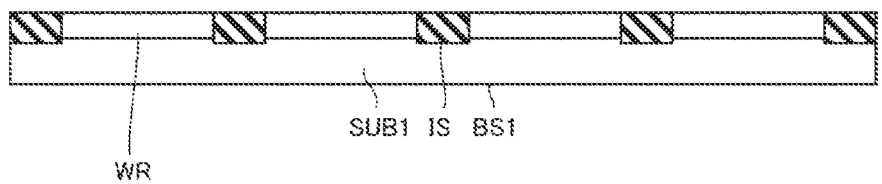
FIG. 9 is a cross-sectional view of the first chip CHP1 of the semiconductor device according to the embodiment in an element separation part forming step S11c.

The device isolation portion forming step S11c is performed after the first ion implantation step S11b. As shown in FIG. 9, in the element isolation part forming step S11c, the element isolation part IS is formed. In the formation of the element isolation part IS, first, groove is formed on the surfaces of the semiconductor substrate SUB1. The trench is formed by an anisotropic etch process such as Reactive Ion Etching.

In the formation of the element isolation part IS, second, the material constituting the element isolation part IS is buried in the groove. The embedding is performed by Chemical Vapor Deposition (CVD) or the like. Third, in the formation of the element isolation part IS, the material of the element isolation part IS protruding from the groove is removed. This is removed by Chemical Mechanical Polishing (CMP).

Figure 10:
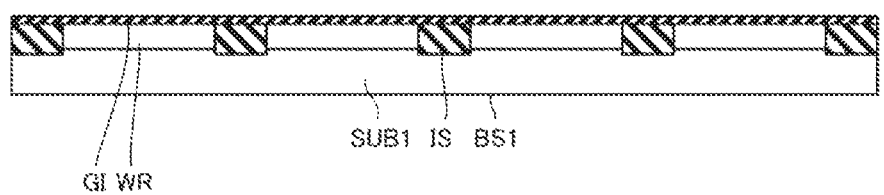
FIG. 10 is a cross-sectional view of the first chip CHP1 of the semiconductor device according to the embodiment in the gate dielectric film forming step S11d.

The gate dielectric film forming step S11d is performed after the device isolation part forming step S11c. As shown in FIG. 10, in the gate dielectric film forming step S11d, the gate dielectric film GI is formed. The gate dielectric film GI is formed, for example, by thermally oxidizing the surfaces of the semiconductor substrate SUB1.

Figure 11:
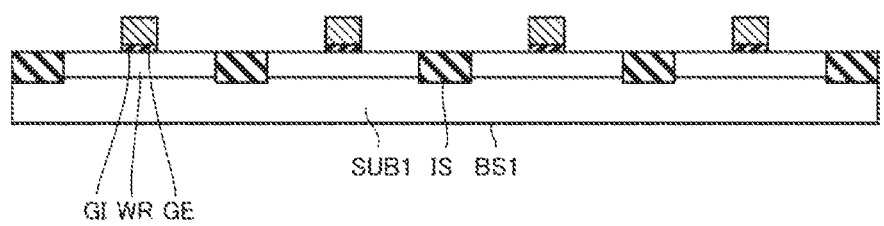
FIG. 11 is a cross-sectional view of a first chip CHP1 of a semiconductor device according to the embodiment in a gate-electrode forming step S11e.

The gate electrode forming step S11e is performed after the gate dielectric film forming step S11d. As shown in FIG. 11, in the gate electrode forming step S11e, the gate electrode GE is formed. In forming the gate electrode GE, first, materials constituting the gate electrode GE are formed on the gate dielectric film GI by CVD or the like. In the formation of the gate electrode GE, second, the material constituting the deposited gate electrode GE is patterned using photolithography and anisotropic etching.

Figure 12:
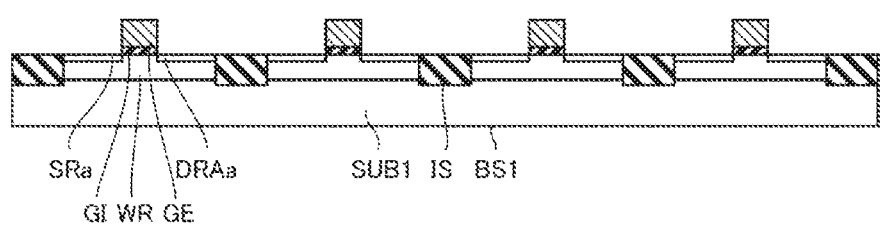
FIG. 12 is a cross-sectional view of the first chip CHP1 of the semiconductor device according to the embodiment in the second ion implantation step S11f.

The second ion implantation step S11f is performed after the gate electrode forming step S11e. As shown in FIG. 12, in the second ion implantation step S11f, the first portion SRa and the first portion DRAa are formed. The first portion SRa and the first portion DRAa are formed by ion implantation using the gate electrodes GE as masks.

Figure 13:
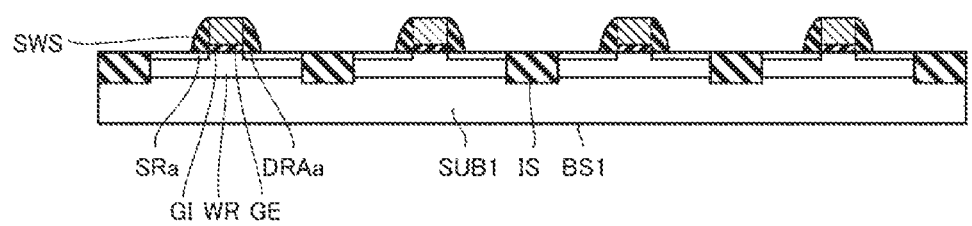
FIG. 13 is a cross-sectional view of a first chip CHP1 of a semiconductor device according to the embodiment in a sidewall spacer forming step S11g.

The sidewall spacer forming step S11g is performed after the second ion implantation step S11f. As shown in FIG. 13, in the sidewall spacer forming step S11g, the sidewall spacers SWS are formed. In forming the sidewall spacer SWS, firstly, materials constituting the sidewall spacers SWS are formed on the semiconductor substrate SUB1 by CVD or the like so as to cover the gate electrodes GE. In the formation of the sidewall spacer SWS, second, the material constituting the deposited sidewall spacer SWS is etched back by an anisotropic etching process.

Figure 14:
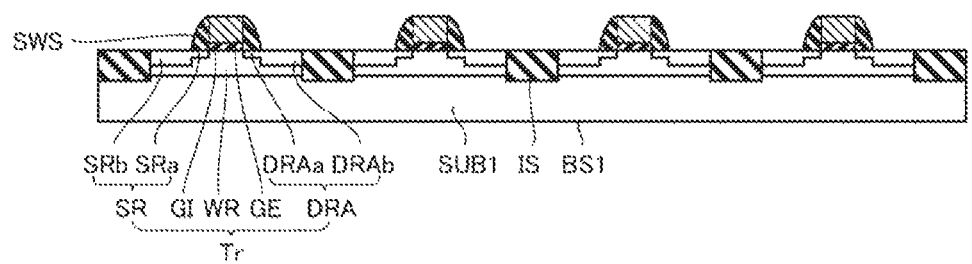
FIG. 14 is a cross-sectional view of the first chip CHP1 of a semiconductor device according to the embodiment in a third ion implantation step S11h.

The third ion implantation step S11h is performed after the sidewall spacer forming step S11g. As shown in FIG. 14, in the third ion implantation step S11h, the second portion SRb and the second portion DRAb are formed. The second portion SRb and the second portion DRAb are formed by, for example, ion implantation using the gate electrodes GE and the sidewall spacer SWS as masks.

Figure 15:
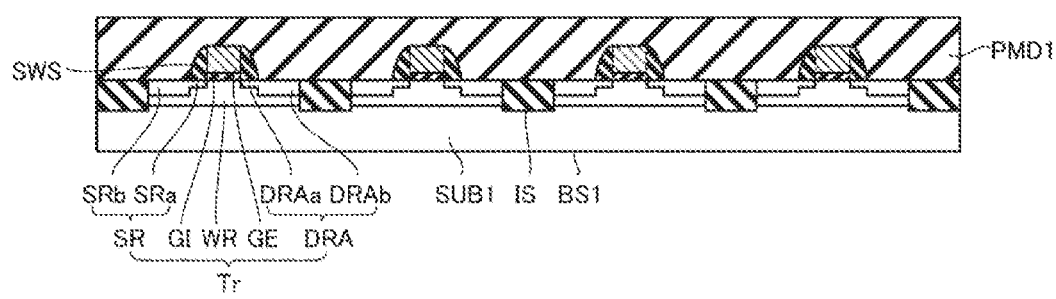

The premetal insulating film forming step S12a is performed after the third ion implantation step S11h. As shown in FIG. 15, in the pre metal insulating film forming step S12a, the pre metal insulating film PMD1 is formed. In forming the pre metal insulating film PMD1, first, materials constituting the premetal insulating film PMD1 are formed by CVD or the like so as to cover the transistor Tr. In forming the premetal insulating film PMD1, second, the materials constituting the formed premetal insulating film PMD1 are planarized. This planarized is performed, for example, by CMP.

Figure 16:
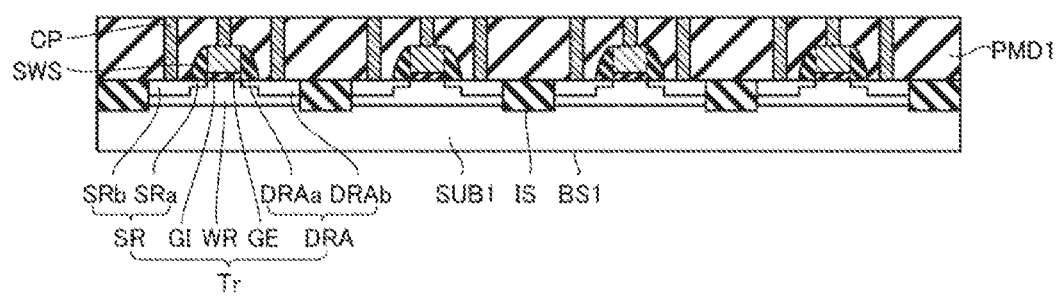
FIG. 16 is a cross-sectional view of the first chip CHP1 of the semiconductor device according to the embodiment in the contact plug forming step S12b.

The contact plug forming step S12b is performed after the premetal insulating film forming step S12a. As shown in FIG. 16, in the contact plug forming step S12b, the contact plug CP is formed. In forming the contact plug CP, first, contact hole is formed in the premetal insulating film PMD1. The contact hole is formed by anisotropic etching. In the formation of the contact plug CP, second, a material constituting the contact plug CP is buried in the contact hole by CVD or the like. Third, in the formation of the contact plug CP, the material of the contact plug CP protruding from the contact hole is removed by CMP or the like.

Figure 17:
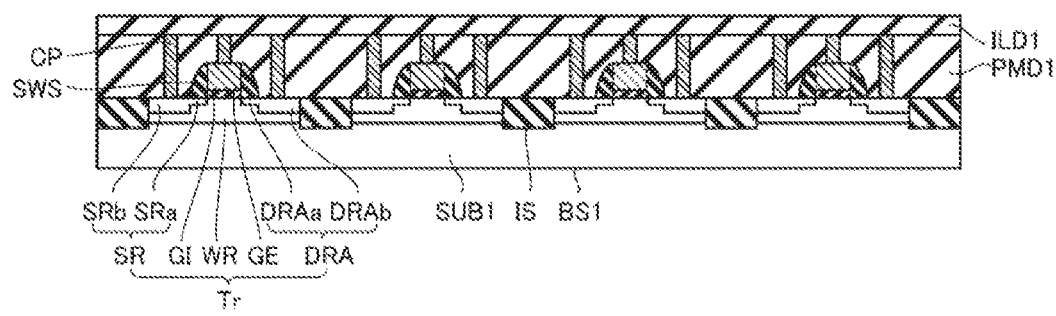
FIG. 17 is a cross-sectional view of the first chip CHP1 of the semiconductor device according to the embodiment in the first interlayer dielectric film forming step S12c.

The first interlayer insulating film forming step S12c is performed after the contact plug forming step S12b. As shown in FIG. 17, in the first interlayer insulating film forming step S12c, the interlayer insulating film ILD1 is formed. The interlayer insulating film ILD1 is formed by forming materials constituting the interlayer insulating film ILD1 by, for example, CVD or the like.

Figure 18:
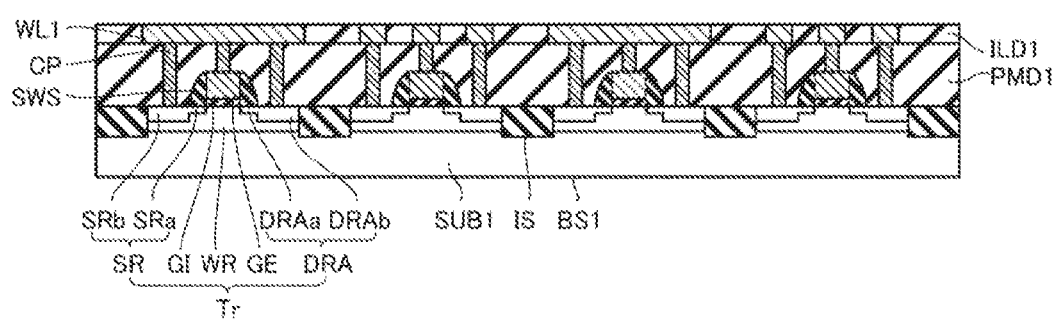
FIG. 18 is a cross-sectional view of the first chip CHP1 of the semiconductor device according to the embodiment in the first wiring forming step S12d.

The first wiring forming step S12d is performed after the first interlayer insulating film forming step S12c. As shown in FIG. 18, in the first wiring forming step S12d, the wiring WL1 is formed. The wiring WL1 is formed by, for example, a single damascene method. More specifically, in forming the wiring WL1, first, wiring trench is formed in an anisotropic etch process in the interlayer insulating film ILD1. In forming the wiring WL1, second, materials constituting the wiring WL1 is embedded in the wiring trench by electroplating. Third, in forming the wiring WL1, the materials constituting the wiring WL1 protruding from the wiring trench are removed by CMP or the like.

Figure 19:
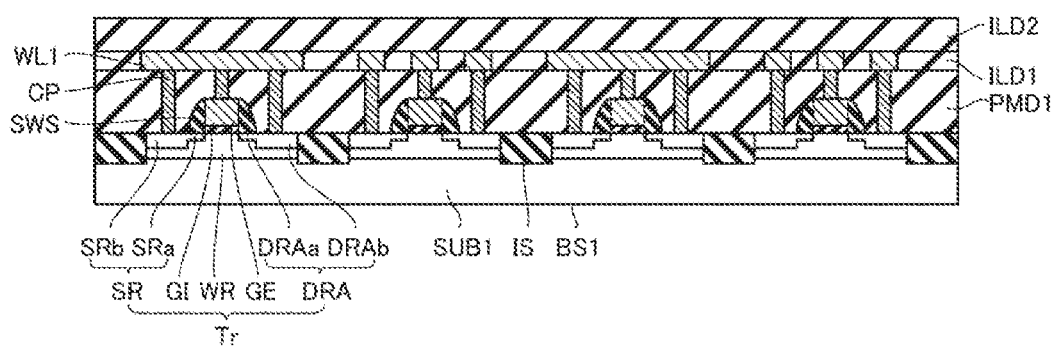
FIG. 19 is a cross-sectional view of the first chip CHP1 of the semiconductor device according to the embodiment in the second interlayer insulating film forming step S12e.

The second interlayer insulating film forming step S12e is performed after the first wiring forming step S12d. As shown in FIG. 19, in the second interlayer insulating film forming step S12e, the interlayer insulating film ILD2 is formed. The interlayer insulating film ILD2 is formed by forming materials constituting the interlayer insulating film ILD2 by, for example, CVD or the like.

Figure 20:
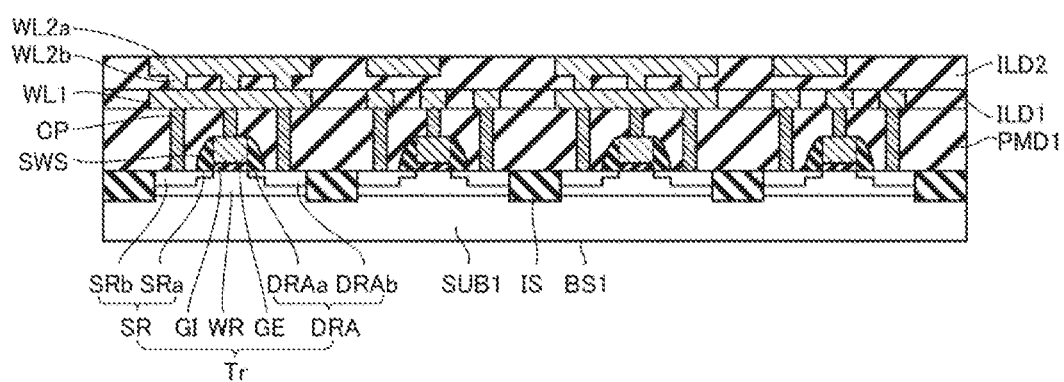
FIG. 20 is a cross-sectional view of the first chip CHP1 of the semiconductor device according to the embodiment in the forming step S12f.

The second wiring forming step S12f is performed after the second interlayer insulating film forming step S12e. As shown in FIG. 20, in the second wiring forming step S12f, the wiring WL2 is formed. The wiring WL2 is formed by, for example, a dual damascene method. More specifically, in forming the wiring WL2, first, a wiring trench and a via trench are formed in an anisotropic etch treatment in the interlayer insulating film ILD2. In forming the wiring WL 2, second, materials constituting the wiring 2 are embedded in the wiring trench and the via trench by electroplating. Third, in forming the wiring WL2, the materials constituting the wiring WL2 protruding from the wiring trench are removed by CMP or the like.

The second interlayer insulating film forming step S12e and the second wiring forming step S12f may be repeatedly performed.

Figure 21:
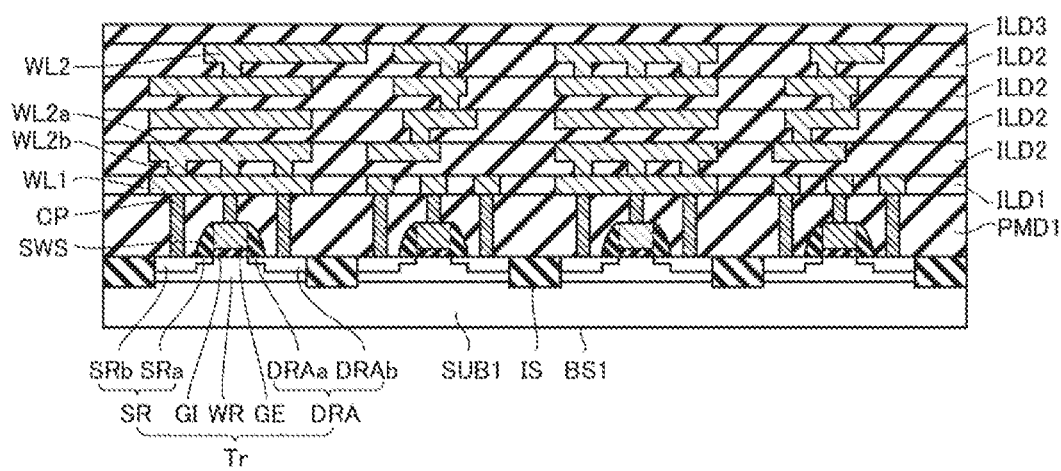
FIG. 21 is a cross-sectional view of the first chip CHP1 of the semiconductor device according to the embodiment in a third interlayer dielectric film forming step S12g.

The third interlayer insulating film forming step S12g is performed after the second wiring forming step S12f. As shown in FIG. 21, in the third interlayer insulating film forming step S12g, the interlayer insulating film ILD3 is formed. The interlayer insulating film ILD3 is formed by forming materials constituting the interlayer insulating film ILD3 by, for example, CVD or the like.

Figure 22:
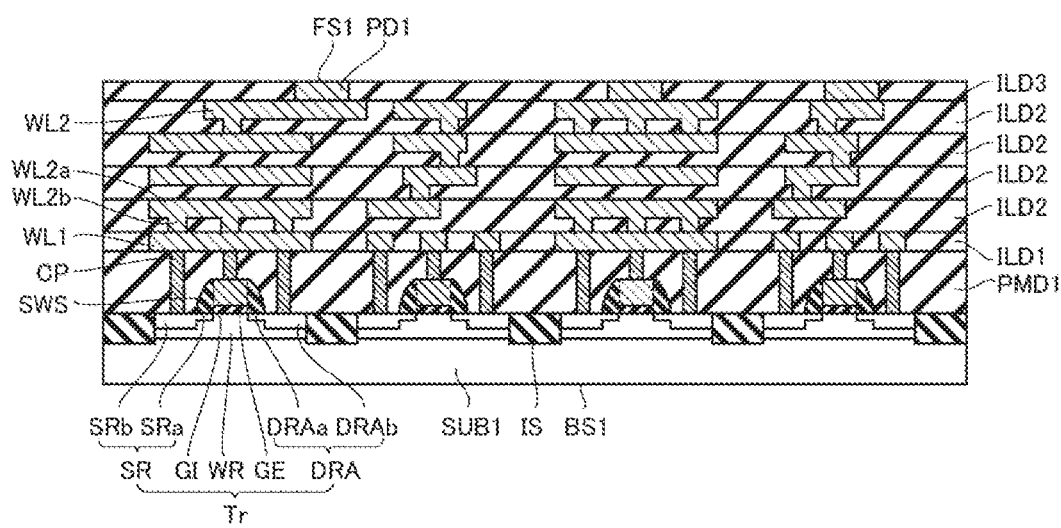
FIG. 22 is a cross-sectional view of the first chip CHP1 of the semiconductor device according to the embodiment in an electrode pad forming step S12h.

The electrode pad forming step S12h is performed after the third interlayer insulating film forming step S12g. As shown in FIG. 22, in the electrode pad forming step S12h, the electrode pad PD1 is formed. The electrode pad PD1 is formed by, for example, a single damascene method. More specifically, in forming the electrode pad PD1, first, a trench is formed in the interlayer insulating film ILD3 by an anisotropic etch process. In forming the electrode pad PD1, second, materials constituting the electrode pad PD1 are embedded in the trench by electroplating. Third, in forming the electrode pad PD1, materials constituting the electrode pad PD1 protruding from the trench are removed by CMP or the like.

Figure 23:
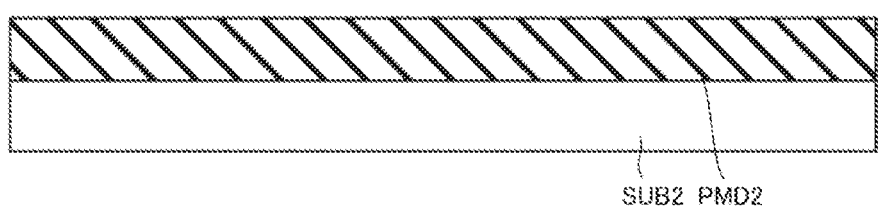
FIG. 23 is a cross-sectional view of the second chip CHP2 of the semiconductor device according to the embodiment in a premetal insulating film forming step S20b.

In the substrate preparation step S20a, preparation of the semiconductor substrate SUB2 is performed. The premetal insulating film forming step S20b is performed after the substrate preparing step S20a. As shown in FIG. 23, in the premetal insulating film forming step S20b, the premetal insulating film PMD2 is formed. The premetal insulating film PMD2 is formed by forming a film of a material constituting the premetal insulating film PMD2 by, for example, CVD or the like.

Figure 24:
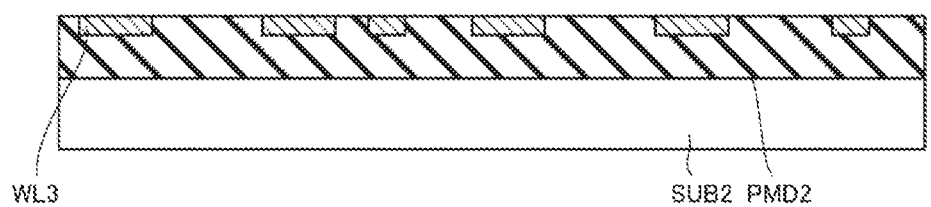
FIG. 24 is a cross-sectional view of the second chip CHP2 of the semiconductor device according to the embodiment in a first wiring forming step S20c.

The first wiring forming step S20c is performed after the premetal insulating film forming step S20b. As shown in FIG. 24, in the first wiring forming step S20c, the wiring WL3 is formed. The wiring WL3 is formed by, for example, a single damascene method. More specifically, in forming the wiring WL3, first, wiring trenches are formed in the interlayer insulating film ILD1 by an anisotropic etch process. In forming the wiring WL4, second, materials constituting the wiring WL3 are embedded in the wiring trench by electroplating. In forming the wiring WL3, the materials that comprise the wiring WL3 protruding from the wiring trench are removed by CMP or the like.

Figure 25:
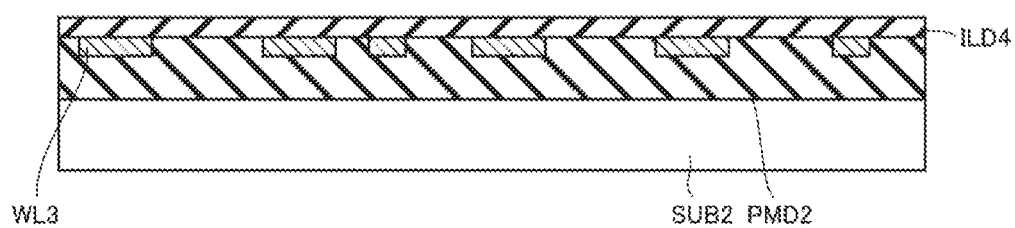
FIG. 25 is a cross-sectional view of the second chip CHP2 of the semiconductor device according to the embodiment in the first interlayer dielectric film forming step S20d.

The first interlayer insulating film forming step S20d is performed after the first wiring forming step S20c. As shown in FIG. 25, in the first interlayer insulating film forming step S20d, the interlayer insulating film ILD4 is formed. The interlayer insulating film ILD4 is formed by forming materials constituting the interlayer insulating film ILD4 by, for example, CVD or the like.

Figure 26:
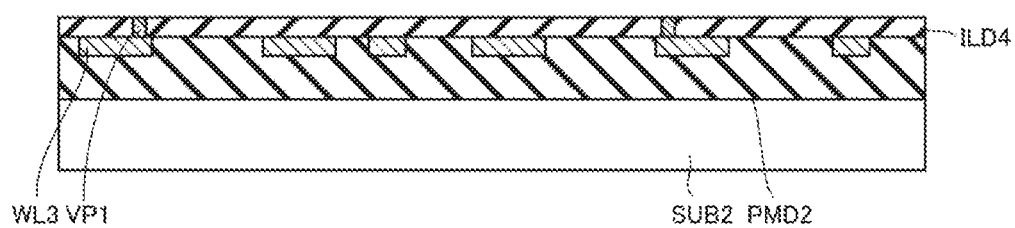
FIG. 26 is a cross-sectional view of the second chip CHP2 of the semiconductor device according to the embodiment in a via plug forming step S20e.

The via plug forming step S20e is performed after the first interlayer insulating film forming step S20d. As shown in FIG. 26, in the via plug forming step S20e, the via plug VP1 is formed. In forming the via plug VP1, first, a via hole is formed in the interlayer insulating film ILD1 by an anisotropic etch process. In forming the via plug VP1, second, materials constituting the via plug VP1 are embedded in the via hole by electroplating. Third, in forming the via plug VP1, materials constituting the via plug VP1 protruding from the via hole are removed by CMP or the like.

Figure 27:
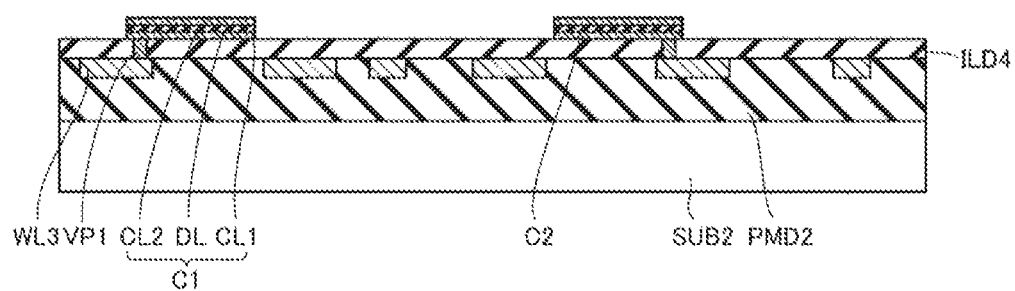
FIG. 27 is a cross-sectional view of the second chip CHP2 of the semiconductor device according to the embodiment in a capacitor forming step S20f.

The capacitor forming step S20f is performed after the via plug forming step S20e. As shown in FIG. 27, in the capacitor forming step S20f, the capacitor C1 and the capacitor C2 (i.e., the conductive film CL1, the dielectric film DL, and the conductive film CL2) are formed.

In forming the capacitor C1 and the capacitor C2, first, materials constituting the conductive film CL1, the dielectric film DL, and the conductive film CL2 are sequentially formed on the interlayer insulating film ILD5. This film formation is performed, for example, by CVD. Note that after the dielectric film DL is formed and before the conductive film CL2 is formed, heat treatment for crystallizing the dielectric film DL is performed.

In forming the capacitor C1 and the capacitor C2, second, the deposited conductive film CL1, the dielectric film DL, and the conductive film CL2 are patterned. The patterning is performed using, for example, photolithography and anisotropic etching.

Figure 28:
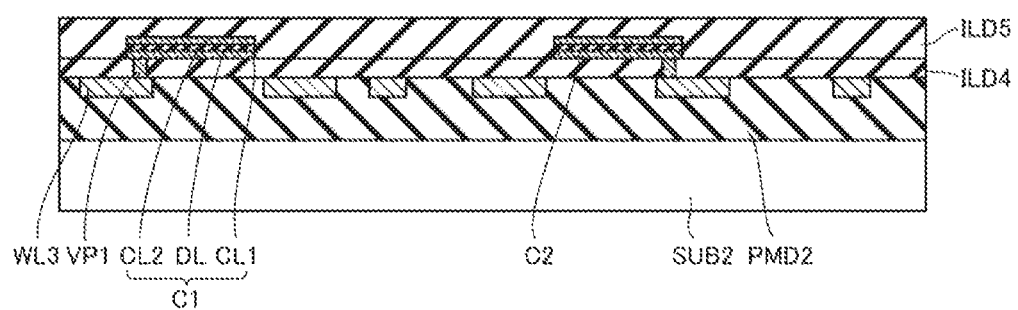
FIG. 28 is a cross-sectional view of the second chip CHP2 of the semiconductor device according to the embodiment in a second interlayer dielectric forming step S20g.

The second interlayer insulating film forming step S20g is performed after the capacitor forming step S20f. As shown in FIG. 28, in the second interlayer insulating film forming step S20g, the interlayer insulating film ILD5 is formed. The interlayer insulating film ILD5 is formed by forming materials constituting the interlayer insulating film ILD5 by, for example, CVD or the like.

Figure 29:
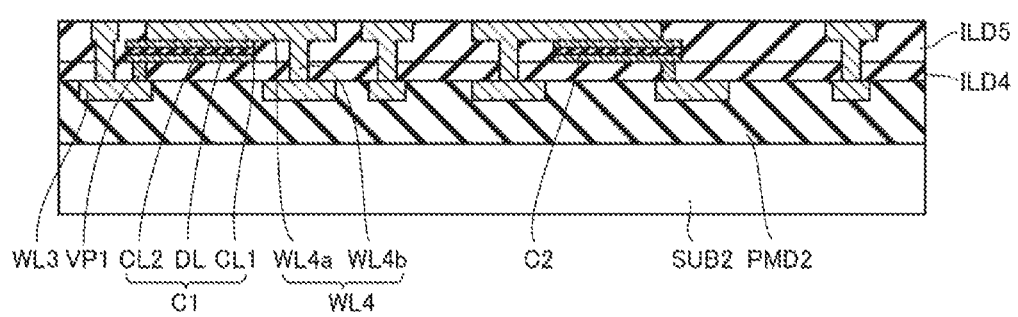
FIG. 29 is a cross-sectional view of the second chip CHP2 of the semiconductor device according to the embodiment in a second wiring forming step S20h.

The second wiring forming step S20h is performed after the second interlayer insulating film forming step S20g. In the second wiring forming step S20h, the wiring WL4 is formed as shown in FIG. 29. The wiring WL4 is formed by, for example, a dual damascene method. More specifically, in forming the wiring WL4, first, a wiring trench and a via trench are formed in an anisotropic etch process in the interlayer insulating film ILD5. In forming the wiring WL4, second, materials constituting the wiring WL4 are embedded in the wiring trench and the via trench by electroplating. Third, in forming the wiring WL4, the materials constituting the wiring WL4 protruding from the wiring trench are removed by CMP or the like.

Figure 30:
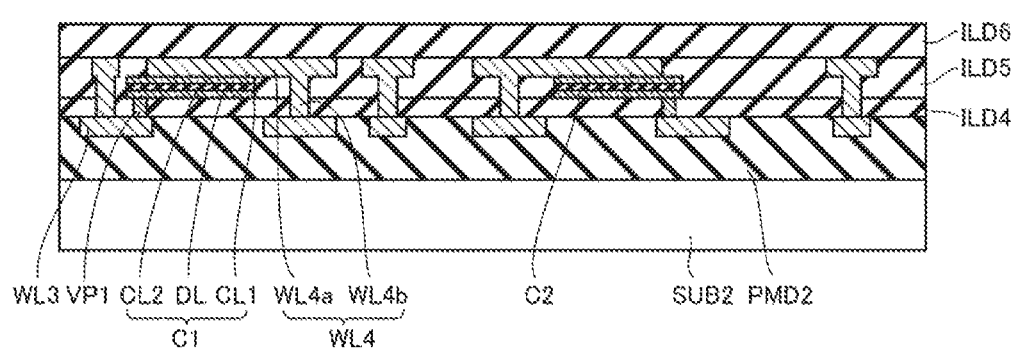
FIG. 30 is a cross-sectional view of the second chip CHP2 of the semiconductor device according to the embodiment in a third interlayer dielectric film forming step S20i.

The third interlayer insulating film forming step S20*i* is performed after the second wiring forming step S20*h*. As shown in FIG. 30, in the third interlayer insulating film forming step S20*i*, the interlayer insulating film ILD6 is formed. The interlayer insulating film ILD6 is formed by forming materials constituting the interlayer insulating film ILD6 by, for example, CVD or the like.

Figure 31:
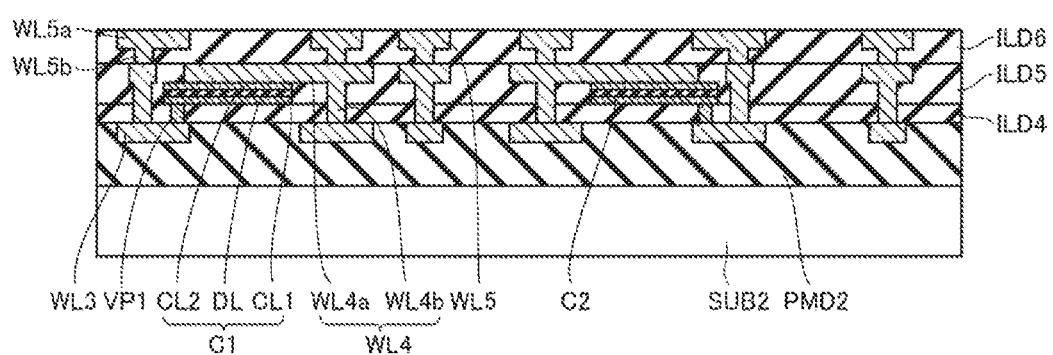
FIG. 31 is a cross-sectional view of a second chip CHP2 of a semiconductor device according to the embodiment in a third wiring forming step S20*j*.

The third wiring forming step S20*j* is performed after the third interlayer insulating film forming step S20*i*. As shown in FIG. 31, in the third wiring forming step S20*j*, the wiring WL5 is formed. The wiring WL5 is formed by, for example, a dual damascene method. More specifically, in forming the wiring WL5, first, a wiring trench and a via trench are formed in an anisotropic etch process in the interlayer insulating film ILD6. In forming the wiring WL5, second, materials constituting the wiring WL5 are embedded in the wiring trench and the via trench by electroplating. Third, in forming the wiring WL5, the materials constituting the wiring WL5 protruding from the wiring trench are removed by CMP or the like.

The first interlayer insulating film forming step S20*d*, the via plug forming step S20*e*, the capacitor forming step S20*f*, the second interlayer insulating film forming step S20*g*, the second wiring forming step S20*h*, the third interlayer insulating film forming step S20*i*, and the third wiring forming step 20*j* may be repeatedly performed.

Figure 32:
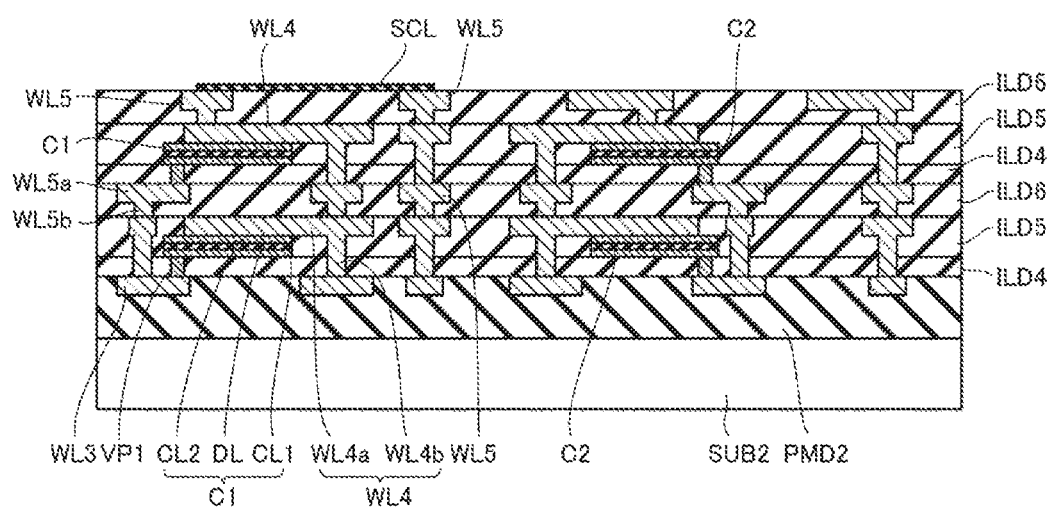
FIG. 32 is a cross-sectional view of the second chip CHP2 of the semiconductor device according to the embodiment in the semiconductor film forming step S20*k*.

The semiconductor film forming step S20*k* is performed after the third wiring forming step S20*j*. That is, the semiconductor film forming step S20*k* is performed after the capacitor forming step S20*f*. As shown in FIG. 32, the semiconductor film SCL is formed in the semiconductor film forming step S20*k*. The semiconductor film SCL is formed by forming a material constituting the semiconductor film SCL by CVD or the like and patterning the formed material constituting the semiconductor film SCL by photolithography and anisotropic etching.

Figure 33:
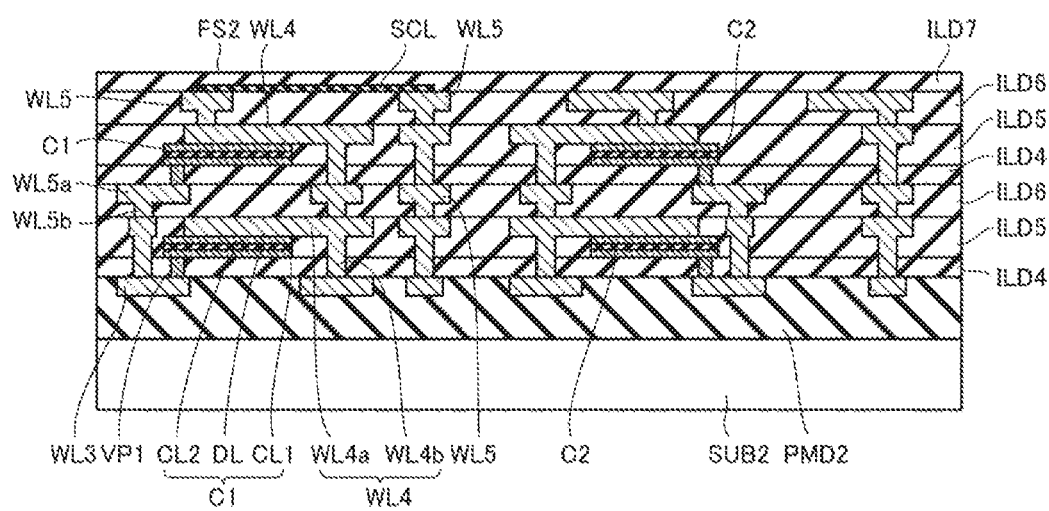
FIG. 33 is a cross-sectional view of the second chip CHP2 of the semiconductor device according to the embodiment in a fourth interlayer insulating film forming step S20*l*.

The fourth interlayer insulating film forming step S20*l* is performed after the semiconductor film forming step S20*k*. As shown in FIG. 33, in the fourth interlayer insulating film forming step S20*l*, the interlayer insulating film ILD7 is formed. The interlayer insulating film ILD7 is formed by forming materials constituting the interlayer insulating film ILD7 by, for example, CVD or the like.

Figure 34:
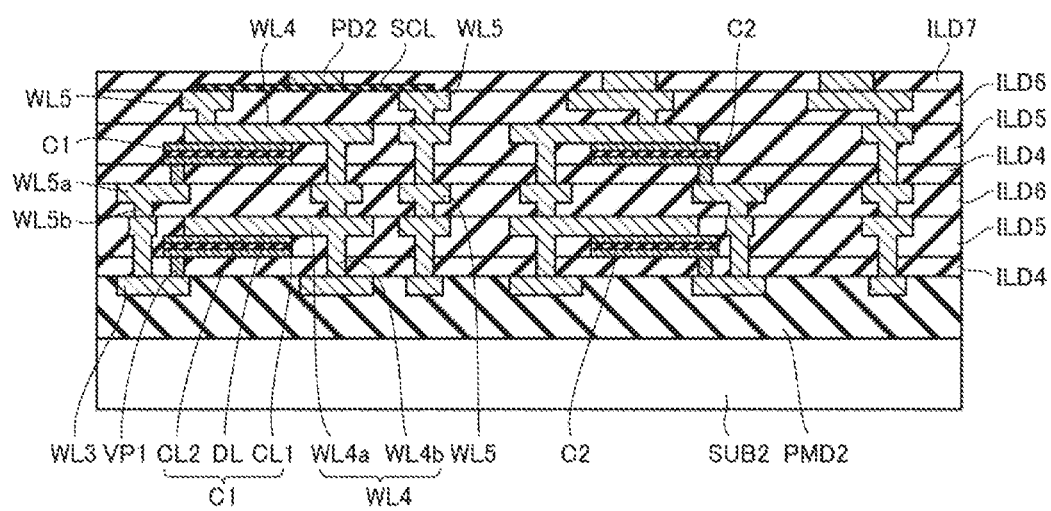
FIG. 34 is a cross-sectional view of the second chip CHP2 of the semiconductor device according to the embodiment in an electrode pad forming step S20*m*.

The electrode pad forming step S20*m* is performed after the fourth interlayer insulating film forming step S20*l*. As shown in FIG. 34, in the electrode pad forming step S20*m*, the electrode pad PD2 is formed. The electrode pad PD2 is formed by, for example, a single damascene method. More specifically, in forming the electrode pad PD2, first, a trench is formed in the interlayer insulating film ILD7 by an anisotropic etch process. In forming the electrode pad PD2, second, materials constituting the electrode pad PD2 are embedded in the trench by electroplating. Third, in forming the electrode pad PD2, materials constituting the electrode pad PD2 protruding from the trench are removed by CMP or the like.

Figure 35:
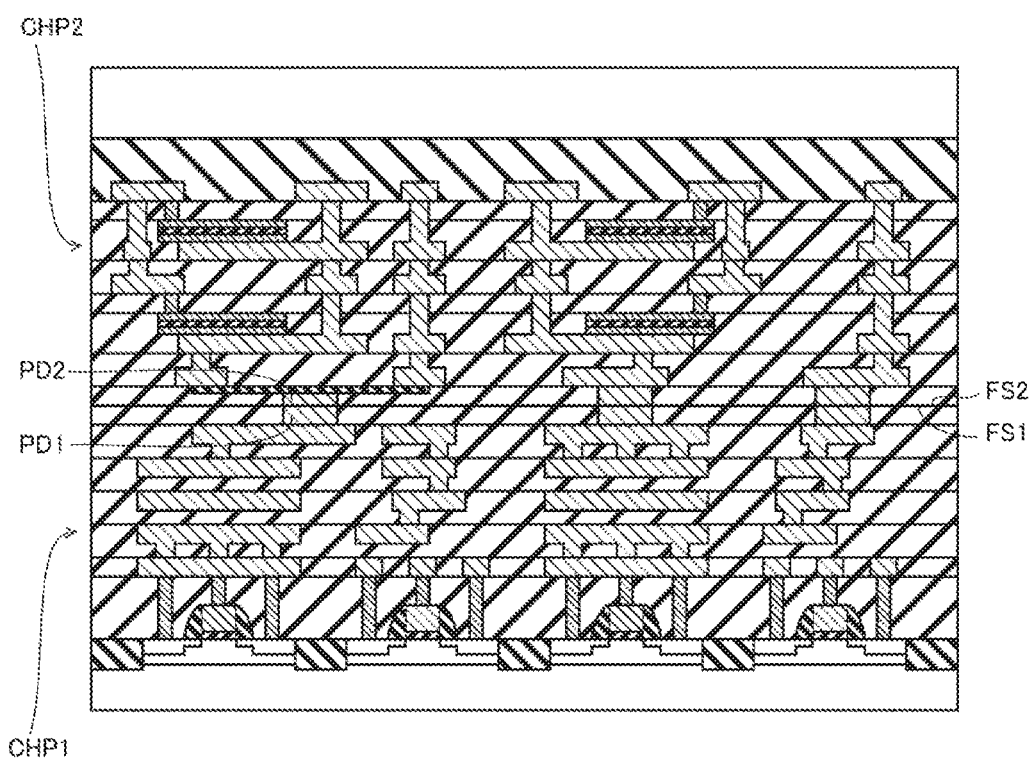
FIG. 35 is a cross-sectional view of the semiconductor device according to the embodiment in laminating step S30.

The laminating step S30 is performed after the first chip forming step S10 and the second chip forming step S20. In the laminating step S30, as shown in FIG. 35, the surface FS1 of the first chip CHP1 and the surface FS2 of the second chip CHP2 are laminated to each other. This laminating is performed, for example, by cleaning the surface FS1 and the surface FS2 by plasma treatment or the like, and by heating the first chip CHP1 and the second chip CHP2 while the surface FS1 and the surface FS2 are in contact with each other.

Figure 36:
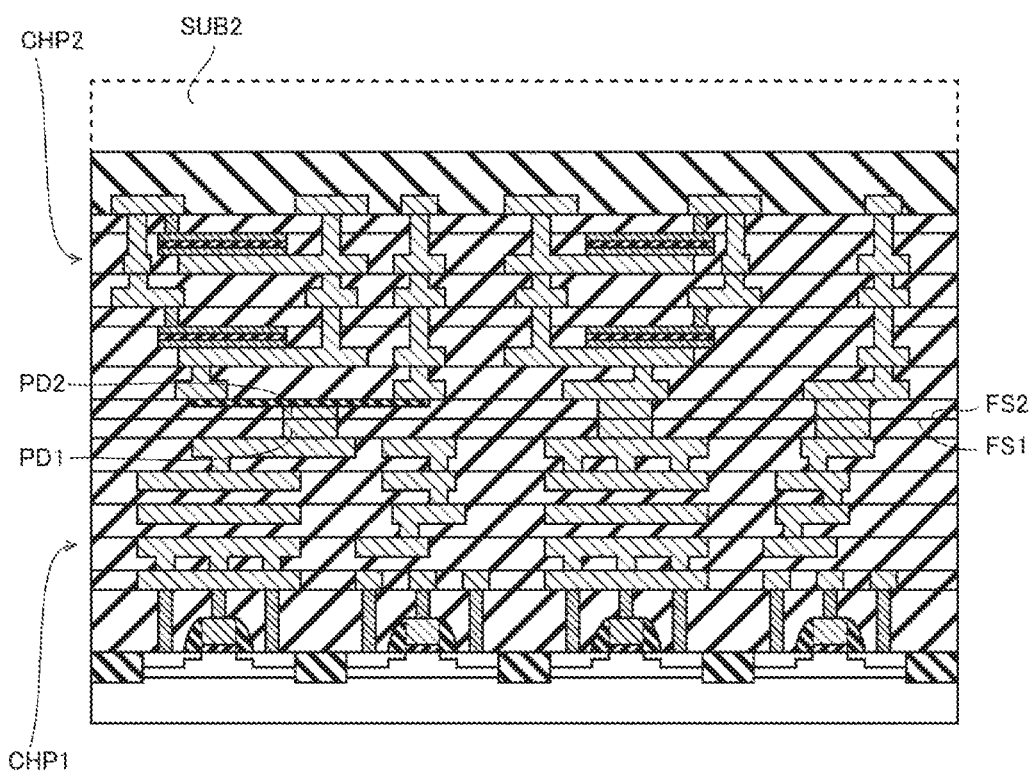
FIG. 36 is a cross-sectional view of the semiconductor device according to the embodiment in a polishing step S40.

The polishing process S40 is performed after the laminating step S30. As shown in FIG. 36, in the polishing step S40, the semiconductor substrate SUB2 is removed by polishing the back surface BS2 of the second tip CHP2.

Figure 37:
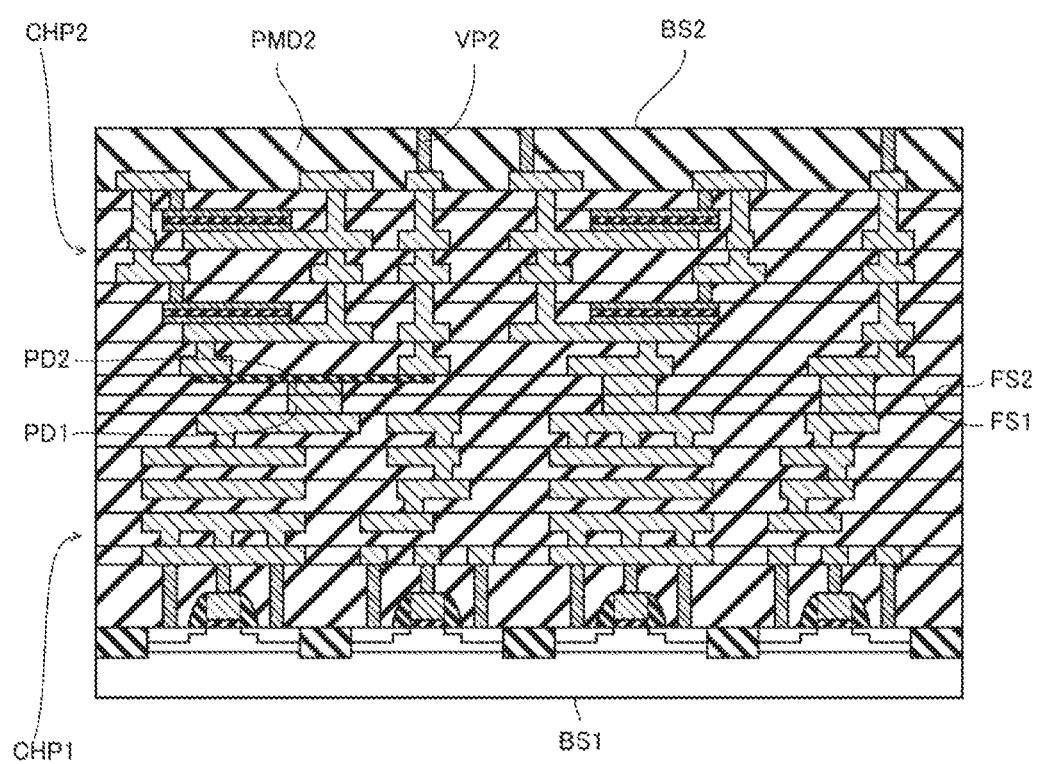
FIG. 37 is a cross-sectional view of the semiconductor device according to the embodiment in a via plug forming step S41.

The via plug forming step S41 is performed after the polishing step S 40. As shown in FIG. 37, in the via plug forming step S 41, the via plug VP2 is formed. First, the via plug VP2 is formed by anisotropically etching the via hole in the premetal insulating film PMD2. In forming the via plug VP2, second, materials constituting the via plug VP2 are embedded in the via hole by electroplating. Third, in forming the via plug VP2, materials constituting the via plug VP2 protruding from the via hole are removed by CMP or the like.

Figure 38:
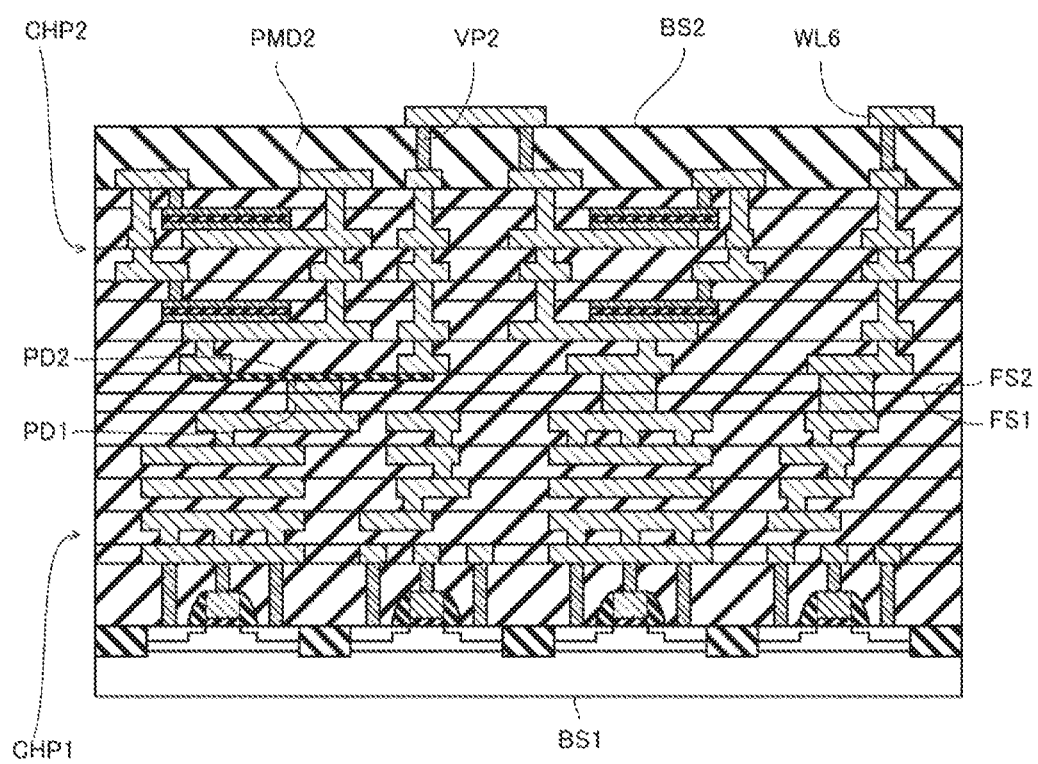
FIG. 38 is a cross-sectional view of the semiconductor device according to the embodiment in a wiring forming step S42.

The wiring forming step S42 is performed after the via plug forming step S41. As shown in FIG. 38, in the wiring forming step S42, wiring WL6 is formed. In forming the wiring WL 6, first, materials constituting the wiring WL6 are formed by sputtering or the like. In forming the wiring WL6, second, the materials making up the deposited wiring WL6 are patterned using photolithography and anisotropic etch processes.

The passivation film forming step S50 is performed after the wiring forming step S42. In the passivation film forming step S50, the passivation film PV is formed. In forming the passivation film PV, first, the material constituting the passivation film PV is formed by forming a film such as CVD. In the formation of the passivation film PV, second, the opening OP is formed by performing photolithography and anisotropic etching.

After the passivation film forming step S50, a dicing step S60 is performed. The dicing step S60 is performed by, for example, dicing blade or laser dicing. As described above, the semiconductor device according to the embodiment shown in FIG. 2 is formed.

Figure 39:
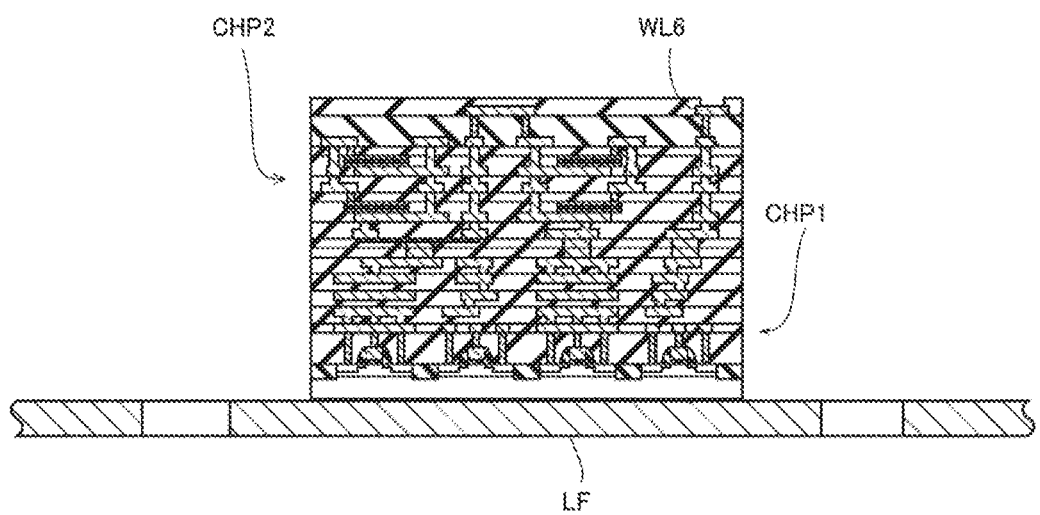
FIG. 39 is a cross-sectional view of a semiconductor device according to the embodiment in a die bonding step S70.

The die bonding step S70 is performed after the dicing step S60. As shown in FIG. 39, in the die bonding step S70, the semiconductor device according to the embodiment is die bonded on the lead frame LF, more specifically, on the die pad of the lead frame LF.

Figure 40:
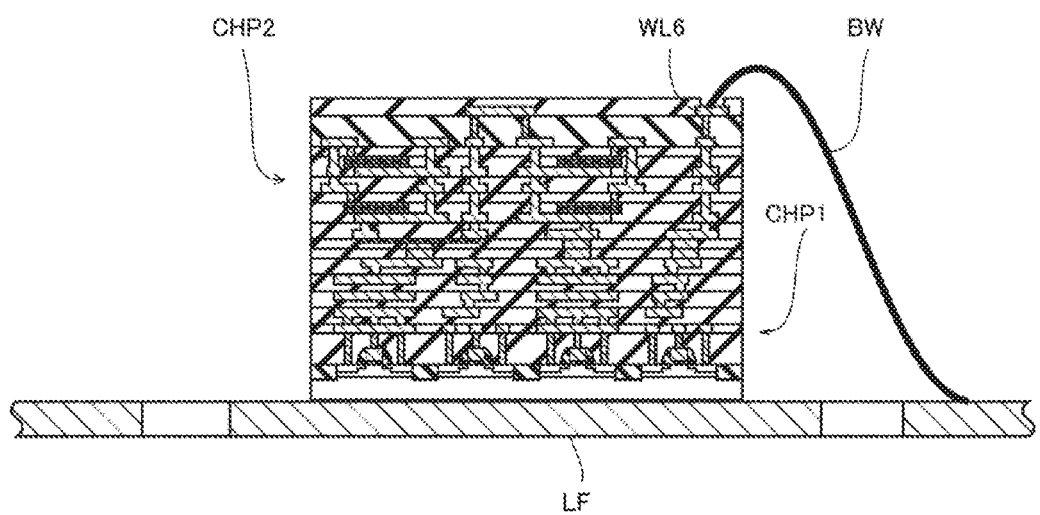
FIG. 40 is a cross-sectional view of the semiconductor device according to the embodiment in wire bonding step S80.

The wire bonding step S80 is performed after the die bonding step S70. In the wire bonding step S80, as shown in FIG. 40, the wiring WL6 exposed from the opening OP and the lead frame LF are connected with each other by bonding wires BW.

The resin sealing step S90 is performed after the wire bonding step S80. In the resin sealing step S90, the semiconductor device, a part of the lead frame LF, and the bonding wire BW according to the embodiment are resin-sealed. After the resin sealing step S90, the outer lead of the lead frame LF protruding outside the sealing resin is molded.

Manufacturing method Effects of the Control System, semiconductor device, and semiconductor device of Embodiments The manufacturing method effects of the Control System, semiconductor device, and semiconductor device of Embodiments are described below.

In the control system according to the embodiment, power for driving the control unit CTR is supplied from the capacitor C1. Therefore, the control system according to the embodiment can downsize the entire system as compared with a case where a button battery or the like is used as a supply source of electric power for driving the control unit CTR.

In the control system according to the embodiment, the capacitor C1 is used as a supply source of power for driving the control unit CTR. The capacitor C1 is less deteriorated with time even when charge and discharge are repeatedly performed. Therefore, according to the control system of the embodiment, it is possible to suppress deterioration with time.

In the control system according to the embodiment, when the operation belonging to the first group is performed, power to the control unit CTR is supplied from both the capacitor C1 and the capacitor C2. On the other hand, in the control system according to the embodiment, when the operation belonging to the second group is performed, the power to the control unit CTR is supplied only from the capacitor C2. Therefore, according to the control system of the embodiment, it is possible to supply power corresponding to the required power to the control unit CTR.

In the control system according to the embodiment, when a formation defect occurs in a part of the capacitor C1, the control unit CTR controls the switching element SW connected to the capacitor C1 in which the formation defect occurs to be in the off state, whereby the capacitor C1 in which the formation defect occurs can be separated from the system.

In the semiconductor device according to the embodiment, the first chip CHP1 includes the control unit CTR, and the second chip CHP2 includes the capacitor C1, the capacitor C2, and the switching device SW. In the semiconductor device according to the embodiment, the first chip CHP1 and the second chip CHP2 are integrated by laminating the surface FS1 and the surface FS2 to each other. Therefore, according to the semiconductor device according to the embodiment, the control systems according to the embodiment can be reduced in size.

The leakage current of the IGZO transistor is relatively smaller than that of the transistor formed in the silicon substrate. Therefore, when the switching element SW is a IGZO transistor, it is possible to suppress the charge accumulated in the capacitor C1 from flowing out through the switching element SW and from flowing into the capacitor C1 which is separated from the system due to the formation failure.

When the dielectric film DL used for the capacitor C1 and the capacitor C2 is formed, heat treatment for crystallization is required. When the switching element SW is formed at a position closer to the front FS2 than the capacitor C1 and the capacitor C2, materials having lower heat resistance than the heat treatment temperatures, such as IGZO, can be used for the switching element SW.

In the manufacturing method of the semiconductor device according to the embodiment, the semiconductor film forming step S20k is performed after the capacitor forming step S20f. Therefore, according to the manufacturing method of the semiconductor device according to the embodiment, materials having low heat resistance, such as IGZO, can be used for the switching element SW.

Although the invention made by the present inventor has been specifically described based on the embodiment, the present invention is not limited to the embodiment described above, and it is needless to say that various modifications can be made without departing from the gist thereof.

What is claimed is:

1. A semiconductor device comprising:
   a first chip having a first surface; and
   a second chip having a second surface,
   wherein the second chip comprises a capacitor and a switching element,
   wherein the first chip comprises a control unit configured to control a conductive state of the switching element,
   wherein the control unit is connected with the capacitor via the switching element by laminating the first surface and the second surface with each other,
   wherein the control unit includes a clock generation circuit configured to generate a clock signal for an operation of the control unit,
   wherein the first chip comprises:
      a first interlayer insulating film; and
      a first electrode pad formed in the first interlayer insulating film, the first electrode pad forming a part of the first surface,
   wherein the second chip comprises:
      a second interlayer insulating film; and
      a second electrode pad formed in the second interlayer insulating film, the second electrode pad forming a part of the second surface, and
   wherein the first electrode pad and the second electrode pad are laminated with each other.

2. The semiconductor device according to claim 1, wherein the switching element is an IGZO transistor.

3. The semiconductor device according to claim 2, wherein the switching element is formed at a position closer to the second surface than the capacitor.

4. The semiconductor device according to claim 1, comprising a power generating element electrically connected with the control unit.

5. The semiconductor device according to claim 4, wherein the power generating element is electrically connected with the capacitor via the switching element.

6. The semiconductor device according to claim 4, wherein the power generating element is a solar cell, a piezoelectric element, or a peltier element.

7. The semiconductor device according to claim 4, wherein the power generating element is electrically connected with the control unit and the capacitor via a diode.

8. A method of manufacturing a semiconductor device, the method comprising:
   forming a first chip having a first surface;
   forming a second chip having a second surface; and
   laminating the first surface and the second surface with each other,
   wherein the second chip comprises a capacitor and a switching element,
   wherein the first chip comprises a control unit controlling a conductive state of the switching element,
   wherein the control unit is connected with the capacitor via the switching element by laminating the first surface and the second surface with each other,
   wherein the switching element is an IGZO transistor, and
   wherein the switching element is formed in the forming the second chip after the forming the capacitor.

* * * * *